Figure 1:
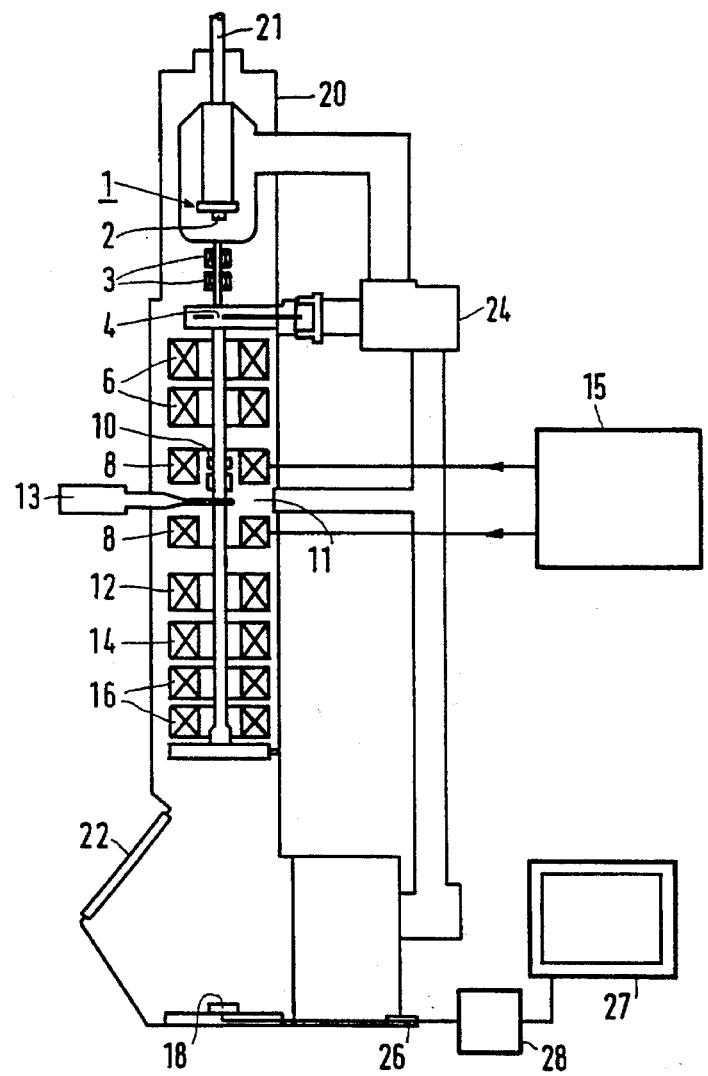

United States Patent [19]
Kruit

[11] Patent Number: 5,466,937
[45] Date of Patent: Nov. 14, 1995

[54] ADDITIVE COMPOSITION OF DEFOCUSING IMAGES IN AN ELECTRON MICROSCOPE

[75] Inventor: Pieter Kruit, Delft, Netherlands

[73] Assignee: U.S. Philips Corporation, New York, N.Y.

[21] Appl. No.: 301,444

[22] Filed: Sep. 6, 1994

[30] Foreign Application Priority Data

Sep. 3, 1993 [BE] Belgium .................. 09300907

[51] Int. Cl.⁶ .................................... H01J 37/26
[52] U.S. Cl. ............................. 250/311; 250/307
[58] Field of Search ..................... 250/311, 307

[56] References Cited

U.S. PATENT DOCUMENTS

| | | | |
|---|---|---|---|
| 4,514,629 | 4/1985 | Smith et al. | 250/311 |
| 5,134,288 | 7/1992 | Van Dyjk et al. | 250/311 |

OTHER PUBLICATIONS

Y. Tanigushi et al, "Active Image Processing as Applied to High Resolution Electron Microscopy [I] Assessment of Misalignment and its Correction", J. Electron Microsc., vol. 39, No. 3, 1990, pp. 137–144.

P. Bonhomme & A. Beorchia, "Image Synthesis In The Electron Microscope", Ultramicroscopy 17, 1985, pp. 127–131.

*Primary Examiner*—Jack L. Berman
*Attorney, Agent, or Firm*—Paul R. Miller

[57] ABSTRACT

A method of forming an image in an electron microscope. Because of the oscillating behaviour of the phase contrast transfer function (PCTF), images made by means of an electron microscope are liable to exhibit contrast whereas the object does not exhibit such contrast. In order to counteract these deviations, it is proposed to form sub-images, each sub-image having its own defocusing of the imaging lens and each sub-image being formed with its own weighting factor, and to add said sub-images. A substantially flat variation of the PCTF is achieved by imparting an oscillating dependence as a function of the defocusing to the weighting factor. The invention offers a simple method of image reconstruction from the sub-images in that the value of the oscillating function has the same sign throughout the defocusing range. The desired image can then be obtained by addition of the sub-images on, for example a photographic film.

12 Claims, 3 Drawing Sheets

ADDITIVE COMPOSITION OF DEFOCUSING IMAGES IN AN ELECTRON MICROSCOPE

The invention relates to a method of forming an image of an object in a particle-optical instrument by way of a number of sub-images formed by means of an imaging lens system, which method comprises the formation of a number of successive sub-images, utilizing a different defocusing adjustment of the imaging lens system for each sub-image, the assignment of a weighting factor to each sub-image thus obtained, the weighting factor as a function of the defocusing being an oscillating function, and the addition of the sub-images multiplied by the weighting factors.

The invention also relates to a particle-optical instrument for carrying out the method.

A method of this kind is known from an article in the magazine "Journal of Electron Microscopy", Vol. 39, No. 3, 1990 pp. 137–144: "Active Image Processing as Applied to High Resolution Electron Microscopy (I) Assessment of Misalignment and Its Correction" by Y. Taniguchi et al.

Methods of forming an image of an object in a particle-optical instrument by addition of a number of sub-images are known per se, for example from an article by P. Bonhomme and A. Beorchia: "Image synthesis in the electron microscope", Ultramicroscopy 17 (1985), pp. 127–132. The cited article, notably the caption of FIG. 2, discloses a method of image reconstruction where an image is formed by addition of three series of sub-images. The first series thereof consists of a single image, whereas the second series consists of a continuous series of images for which the defocusing varies once in time from a lower limit to an upper limit due to linear variation in time of the excitation current of the lens, and the third series consists of a continuous series of images for which the defocusing also varies once in time from a lower limit to an upper limit, again due to a linearly varying lens current. The weighting factor assigned to the sub-images arises from the dwell time of the adjustment of the imaging lens system in a given defocus range. The cited article also describes the use of a lens current which varies sinusoidally in time.

The cited publication by Bonhomme and Beorchia describes that this method enables the formation of images which transmit a wider range of the spatial frequencies present in the object in comparison with a conventional image for which the imaging lens has a fixed focus during the formation of the image.

The image in a particle-optical instrument such as an electron microscope is customarily described by means of the so-called Phase Contrast Transfer Function (PCTF). This function establishes a relationship between the wave function of the imaging particle beam at the area of the object and that at the area of the image. In this PCTF the spatial frequency of the object details acts as a parameter. In all known particle-optical instruments the PCTF varies in an oscillating fashion in dependence on the spatial frequency in the object. This means that a reversal of sign occurs in the amplitude of the image-forming wave. Due to this sign reversal, the contrast formation is dependent not only on the details present in the object to be imaged, but also on the properties of the PCTF, i.e. on the imaging instrument. Consequently, contrast differences may arise which are not caused by contrast in the object but by instrument properties.

In the cited article by Taniguchi et al this drawback is counteracted in that the weighting factor assigned to each sub-image as a function of the defocusing, depends in an oscillating fashion and varies notably alternately positively and negatively. It is thus achieved that instrument properties do not introduce contrast in a wide range of spatial frequencies, despite the oscillating variation of the PCTF. The composition of the sub-images so as to obtain the ultimate desired image is realised according to this known method by computer-controlled recording of the sub-images by means of a television camera, and integration of these sub-images with the associated weighting factor with a TV frame integrator. This requires a given amount of electronic equipment, such as a computer and television equipment.

It is an object of the invention to provide a method enabling simpler reconstruction of the desired image in a particle-optical instrument.

To this end, the method of the invention is characterized in that the value of the oscillating function has the same sign throughout the entire defocusing range.

In a particle-optical instrument, notably a conventional electron microscope, the invention can be used without necessitating major modifications of the instrument. The reconstruction is now carried out by simply adding the sub-images.

The invention is notably characterized in that the weighting factor is adjusted by choosing the exposure time of the sub-images and in that the addition of the sub-images thus obtained takes place by storing the sub-images additively each time on the same record carrier. The record carrier may be a photographic film which is repeatedly exposed on the same places, but it is also possible to store and add the pixels of the image digitally. The record carrier is then formed by a customary storage medium such as a solid-state memory or a magnetic record carrier.

The invention is also characterized in that the adjustment of the weighting factor is obtained by traversing the entire defocusing range at a speed which is a predetermined function of the degree of defocusing, the image recording on the record carrier then taking place continuously. This enables the tracking of time continuous processes in the instrument. It is notably possible to study an object via a television circuit when the defocusing range is traversed periodically with a period which is smaller than the temporal resolution of the human eye.

Figure 2:
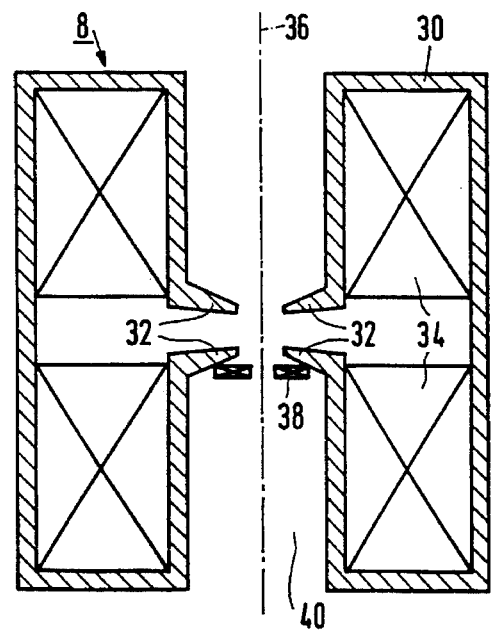
Figure 3:
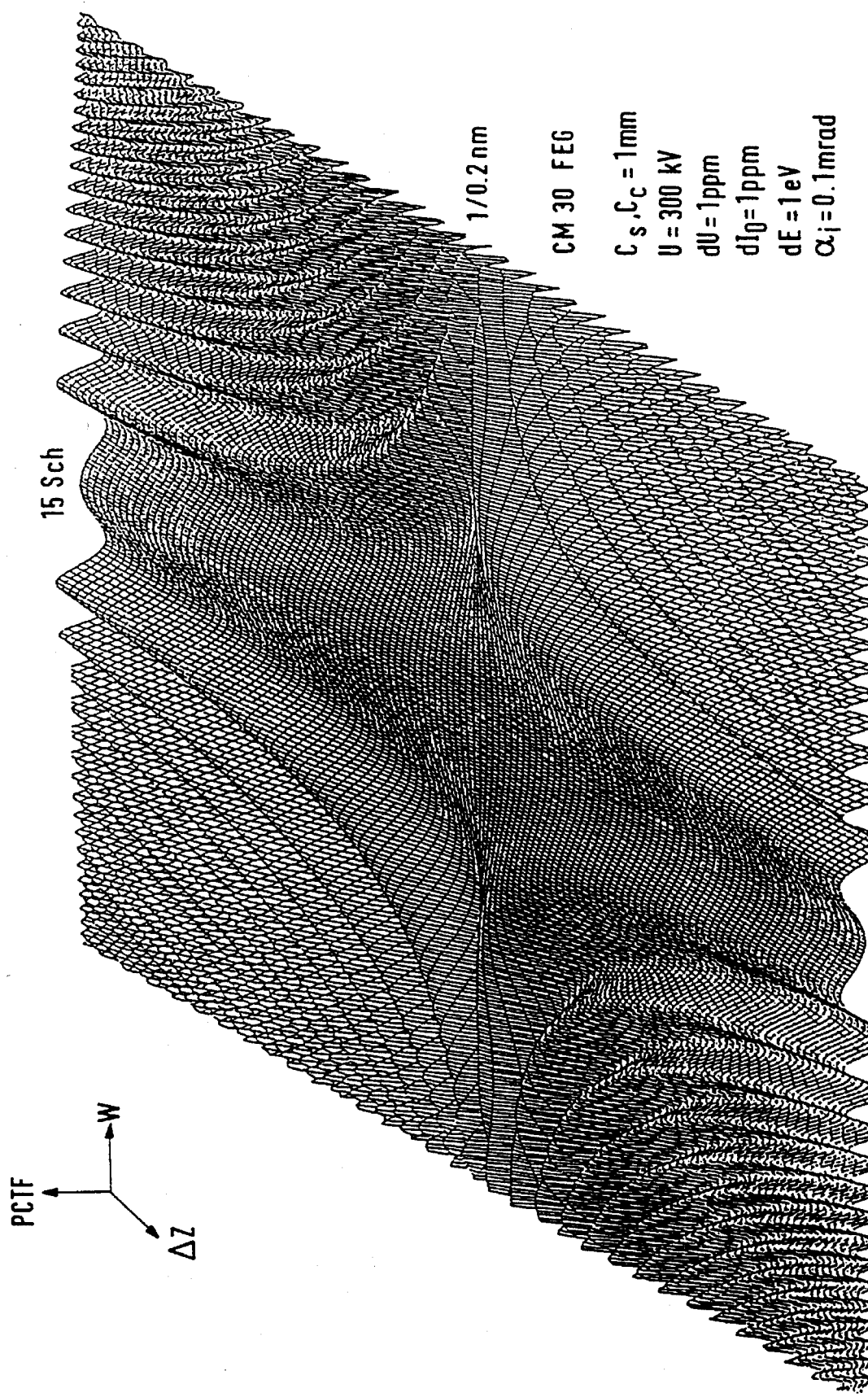
Figure 4:
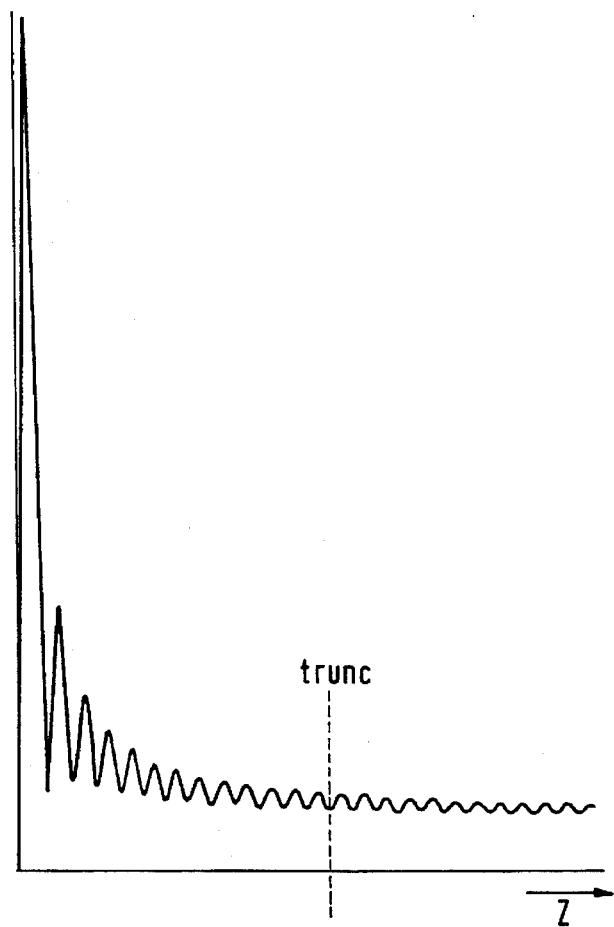
Figure 5:
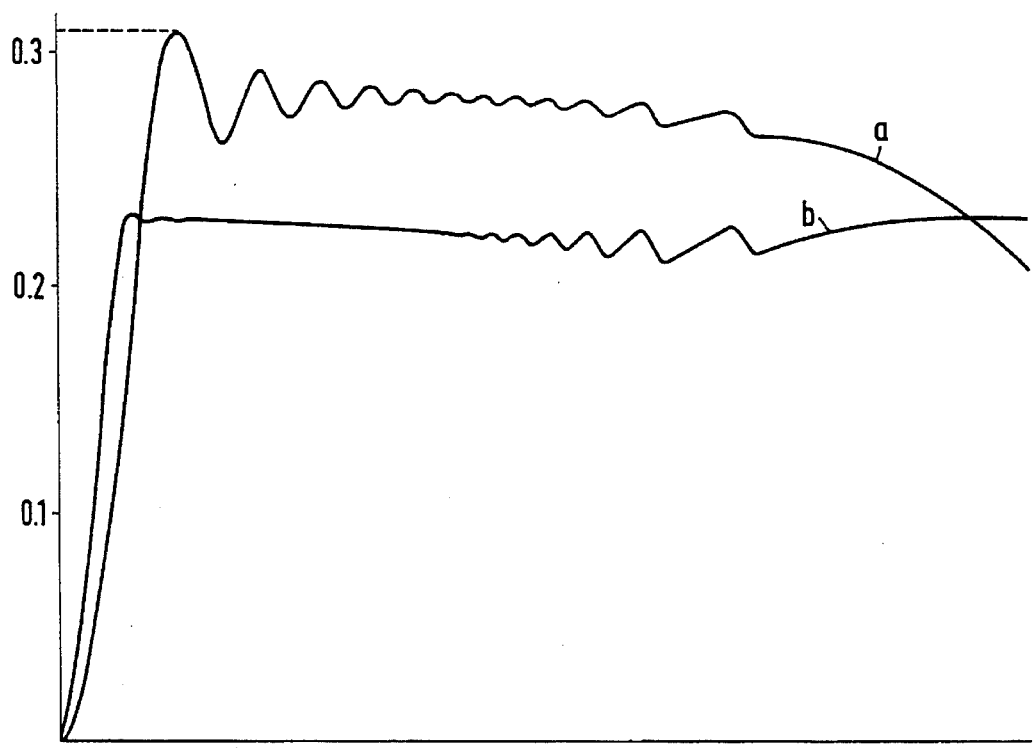

The invention will be described in detail hereinafter with reference to the Figures. Therein:

FIG. 1 is a diagrammatic sectional view of an electron microscope for carrying out the method in accordance with the invention, FIG. 2 is a diagrammatic sectional view of an objective lens for use in an imaging lens system in the electron microscope shown in FIG. 1, FIG. 3 shows graphically a Phase Contrast Transfer Function in dependence on the spatial frequencies in the object and the defocusing of the imaging lens system, FIG. 4 is a graphic representation of the defocusing function for use in the method and the instrument in accordance with the invention, FIG. 5 is a graphic representation of the Phase Contrast Transfer Function, resulting from FIG. 4, for interrupted as well as continued application of the defocusing function.

The electron microscope shown in FIG. 1 comprises a particle source which is constructed as an electron source 1 and which comprises an electron-emissive element 2, a beam alignment system 3, a beam diaphragm 4, a condensor lens 6, an objective lens 8, a beam scanning system 10, an object space 11 accommodating a specimen carrier 13, a diffraction lens 12, an intermediate lens 14, a projection lens 16 and an electron detector 18. The objective lens 8, the intermediate lens 14 and the projection lens 16 together constitute an imaging lens system. These elements are accommodated in a housing 20 provided with an electric power supply lead 21 for the electron source, a viewing window 22 and a vacuum pumping device 24. The electron microscope also comprises a recording unit for recording images produced by the lens system on a record carrier. The recording unit comprises an electron detector 18, an image processing unit 28 with an image memory, and a video display 27 for observation of the images formed. The electron detector 18 comprises an electron-sensitive entrance face; to this end, it may be constructed as a semiconductor detector, for example consisting of a matrix of electron-sensitive diodes which can be individually read. Each of these detector elements is individually connected to a terminal 26 which is accessible from the outside. In order to avoid loss of information, notably for high signal frequencies, the detector elements are preferably constructed so as to be integral with a first signal amplifier stage. To this end, this stage is accommodated in the housing 20 and coupled directly to each individual diode. The manipulation of the detector signals, for example the addition of the various sub-images, can then be performed with signals after the first amplifier stage.

In order to achieve the desired defocusing variation, the excitation coils of the objective lens 8 are connected to a control unit 15 which, in accordance with the invention, is operative to control the excitation of the imaging lens system in conformity with a predetermined, time-dependent oscillating function. Defocusing is controlled, for example in that the defocusing function yet to be described is stored in the form of discrete values in a memory, for example in the form of PCM words. This memory can be read by addressing at a given speed, so that the samples of the defocusing function appear on the data output of the memory at the desired speed. The defocusing function becomes available after digital-to-analog conversion.

FIG. 2 shows an objective lens 8 for use in an electron microscope in accordance with the invention. The lens comprises an iron circuit 30 with poles 32. An optical axis 36 is thus defined. The magnetic lens is excited by coils 34 which are accommodated within the iron circuit in a customary manner. Around the optical axis 36 and directly below the poles 32 an auxiliary coil 38 is accommodated in a cavity 40 of the iron circuit in order to realise the defocusing. This position of the auxiliary coil ensures that this coil is shielded from external interference fields by the iron circuit. Because the auxiliary coil does not enclose iron of the iron circuit in this position, moreover, high frequency defocusing fields, if any, will generate hardly any eddy currents. Consequently, this configuration is particularly suitable for observing objects at video frequency.

FIG. 3 shows a Phase Contrast Transfer Function (PCTF) as it may occur in an existing electron microscope. This PCTF does not take into account formation of contrast by absorption of electrons in the specimen; this often occurs in the case of biological specimens in which mainly phase contrast occurs. In this graphic representation the spatial frequency of the specimen is plotted horizontally and the degree of defocusing is plotted perpendicularly thereto in the plane of drawing. The phase contrast is shown perpendicularly to the plane of defocusing and spatial frequency. This PCTF has been determined for a Philips electron microscope type CM 30 with an electron source of the field-emission type. A value of 1 mm has been assumed for the coefficient of spherical aberration $C_s$ as well as for the coefficient of chromatic aberration $C_c$, a value of 300 kV for the electron accelerating voltage, a value of 1 ppm for the deviation of the accelerating voltage, a value of 1 eV for the spread in electron energy, and a value of 0.1 mrad for the angle of aperture of the imaging beam. This Figure clearly shows the reversals of the sign of the PCTF which could cause a contrast in an image even though this contrast is not really present in the object to be imaged.

FIG. 4 shows graphically the defocusing function. The defocusing is plotted horizontally and the weighting factor for the sub-images is plotted vertically. The entire z-region shown in the graph corresponds to 13.5 μm. When a region Δz is chosen in this graph, a time interval Δt will correspond thereto. This time interval is the dwell time associated with the value of z around which the region Δz has been chosen.

FIG. 5 is a graphic representation of the resultant PCTF; therein, the curve b is determined with a defocusing function applied across the entire region shown in FIG. 4. The curve a has been determined by means of the part of the defocusing function situated between the value 0 and 7 μm as denoted by the vertical dashed line in FIG. 4. The scale of the PCTF of FIG. 5 is determined on the basis of a PCTF without defocusing and addition of sub-images. The minimum and maximum values that can be assumed by this PCTF are set to −1 and +1, respectively. Assuming that the same number of electrons participates in the image, the PCTF of FIG. 5 is then determined; it appears that on the scale thus determined the PCTF moves between the values 0 and 0.3. It is to be noted that the two curves of FIG. 5 have been obtained by utilizing only the defocusing function for positive values of z (the defocusing).

FIGS. 4 and 5 have been determined on the basis of the following assumptions: a Philips microscope type EM 420, an accelerating voltage of 100 kV for the imaging electrons, a spherical aberration coefficient $C_s$=2.7 mm, and a desired region in which the PCTF is flat, corresponding to a detail size in the object of from 1 to 10 nm. (For these values of the resolution, the chromatic aberration coefficient $C_c$ is not important; it can also be chosen to be equal to 2.7 mm, if desired).

I claim:

1. A method of forming an image of an object in a particle-optical instrument by way of a number of sub-images formed by means of an imaging lens system, which method comprises:

the formation of a number of successive sub-images, utilizing a different defocusing adjustment of the imaging lens system for each sub-image, the assignment of a weighting factor to each sub-image thus obtained, the dependence of the weighting factor as a function of the defocusing being an oscillating function, the addition of the sub-images multiplied by the weighting factors, characterized in that the value of the oscillating function has the same sign throughout the entire defocusing range.

2. A method as claimed in claim 1, characterized in that the weighting factor is adjusted by choosing the exposure time of the sub-images, and the addition of the sub-images thus obtained is realised by storing these sub-images additively each time on the same record carrier.

3. A method as claimed in claim 2, characterized in that the adjustment of the weighting factor is obtained by traversing the entire defocusing range at a speed which is a predetermined function of the degree of defocusing, the image recording on the record carrier then taking place continuously.

4. A method as claimed in claim 1, characterized in that the adjustment of the weighting factor is obtained by traversing the entire defocusing range at a speed which is a predetermined function of the degree of defocusing, the defocusing range being traversed periodically with a period which is smaller than the temporal resolution of the human eye.

5. A particle-optical instrument for forming an image, which instrument comprises

- a particle source (1) for emitting particles moving along an optical axis (36) of the instrument,
- a specimen carrier (13) for positioning an object to be imaged by the instrument at the area of the optical axis,
- an imaging lens system (8, 14, 16) for forming images of an object to be imaged,
- a recording unit (18, 28, 27) for recording images produced by the lens system on a record carrier,
- a control unit (15) which is operative to control the excitation of the imaging lens system, characterized in that the control unit (15) is operative to excite the lens system in conformity with a predetermined, time-dependent oscillating function whose value has the same sign throughout the entire defocusing range.

6. A particle-optical instrument as claimed in claim 5, characterized in that the recording unit (18, 27, 28) is operative to add the sub-images on one record carrier.

7. A particle-optical instrument as claimed in claim 5, characterized in that the instrument comprises a video monitor for the display of the sub-images, and that the control unit is operative to traverse the defocusing range periodically with a period which is smaller than the temporal resolution of the human eye.

8. A particle-optical instrument as claimed in claim 5, characterized in that the imaging lens system comprises a coil which is arranged around the optical axis of the instrument and between the poles of an objective lens which forms part of the imaging lens system.

9. A particle-optical instrument as claimed in claim 5, characterized in that the imaging lens system comprises an electrostatic lens whose optical axis is coincident with that of the instrument and which is arranged between the poles of an an objective lens forming part of the imaging lens system.

10. A particle-optical instrument as claimed in claim 9, in which the electrostatic lens is formed by two electrodes, characterized in that at least one of the electrodes is formed by a surface of the specimen carrier.

11. A particle-optical instrument as claimed in claim 5, characterized in that the imaging lens system comprises an auxiliary coil (38) whose optical axis (36) is coincident with that of the instrument and which is arranged underneath the poles (32) of an objective lens (8) forming part of the imaging lens system (8, 14, 16).

12. A particle-optical instrument as claimed in claim 11, characterized in that the auxiliary coil (38) is accommodated in a cavity (40) of the iron circuit (30) of the objective lens (8).

* * * * *